United States Patent
Tsukui et al.

(10) Patent No.: US 9,934,997 B2
(45) Date of Patent: Apr. 3, 2018

(54) ADHESIVE SHEET AND METHOD OF MANUFACTURING ELECTRONIC COMPONENT

(71) Applicant: Denka Company Limited, Tokyo (JP)

(72) Inventors: Tomoya Tsukui, Shibukawa (JP); Gosuke Nakajima, Shibukawa (JP)

(73) Assignee: DENKA COMPANY LIMITED, Tokyo (JP)

( * ) Notice: Subject to any disclaimer, the term of this patent is extended or adjusted under 35 U.S.C. 154(b) by 9 days.

(21) Appl. No.: 15/326,195

(22) PCT Filed: Jul. 6, 2015

(86) PCT No.: PCT/JP2015/069446
§ 371 (c)(1),
(2) Date: Jan. 13, 2017

(87) PCT Pub. No.: WO2016/009879
PCT Pub. Date: Jan. 21, 2016

(65) Prior Publication Data
US 2017/0200629 A1 Jul. 13, 2017

(30) Foreign Application Priority Data
Jul. 14, 2014 (JP) .................. 2014-144531

(51) Int. Cl.
| | |
|---|---|
| H01L 21/67 | (2006.01) |
| H01L 21/683 | (2006.01) |
| C09J 4/06 | (2006.01) |
| C09J 7/02 | (2006.01) |
| C09J 133/10 | (2006.01) |
| C09J 5/06 | (2006.01) |
| H01L 21/78 | (2006.01) |

(52) U.S. Cl.
CPC ............ *H01L 21/6836* (2013.01); *C09J 4/06* (2013.01); *C09J 5/06* (2013.01); *C09J 7/0203* (2013.01); *C09J 133/10* (2013.01); *H01L 21/78* (2013.01); *C09J 2203/326* (2013.01); *C09J 2205/31* (2013.01); *C09J 2433/00* (2013.01); *H01L 2221/68336* (2013.01)

(58) Field of Classification Search
CPC ............... H01L 21/67; H01L 21/67132; H01L 21/6836; H01L 51/5246
See application file for complete search history.

(56) References Cited

U.S. PATENT DOCUMENTS

| | | | |
|---|---|---|---|
| 2006/0204749 A1 | 9/2006 | Kita et al. | 428/343 |
| 2013/0092318 A1 | 4/2013 | Saito et al. | 156/250 |
| 2014/0011025 A1 | 1/2014 | Ishiba et al. | 428/355 AC |

FOREIGN PATENT DOCUMENTS

| | | |
|---|---|---|
| JP | 2006-49509 A | 2/2006 |
| JP | 2007-100064 A | 4/2007 |
| JP | 2007-246633 A | 9/2007 |
| JP | 2012-39053 A | 2/2012 |
| JP | 2013-143489 A | 7/2013 |
| WO | WO 2013/105455 A1 | 7/2013 |
| WO | WO 2013/175987 A1 | 11/2013 |

OTHER PUBLICATIONS

International Search Report dated Oct. 6, 2015, issued to International Application No. PCT/JP2015/059446.

*Primary Examiner* — Mohammad Choudhry
(74) *Attorney, Agent, or Firm* — Stein IP, LLC

(57) ABSTRACT

An adhesive sheet is provided that is capable of inhibiting scraping up of an adhesive in the dicing step, does not cause chip detachment during dicing processing, facilitates picking up, and does not readily develop adhesive transfer. According to the present invention, an adhesive sheet is provided that comprises a substrate film and an adhesive layer laminated on the film, wherein the adhesive layer contains 100 parts by mass of a (meth)acrylate copolymer, from 5 to 250 parts by mass of a photopolymerizable compound, from 20 to 160 parts by mass of a softener, from 0.1 to 30 parts by mass of a curing agent, and from 0.1 to 20 parts by mass of a photopolymerization initiator, and the photopolymerizable compound has a weight average molecular weight from 40,000 to 220,000.

5 Claims, No Drawings

ADHESIVE SHEET AND METHOD OF MANUFACTURING ELECTRONIC COMPONENT

CROSS-REFERENCE TO RELATED APPLICATIONS

This application is a national stage of International Application No. PCT/JP2015/069446, filed Jul. 6, 2015, which claims the benefit of priority to Japanese Application No. 2014-144531, filed Jul. 14, 2014, in the Japanese Patent Office, the disclosures of which are incorporated herein in their entireties by reference.

TECHNICAL FIELD

The present invention relates to an adhesive sheet used in a procedure of manufacturing an electronic component and a method of manufacturing an electronic component using the same.

BACKGROUND ART

A semiconductor wafer or a substrate is bonded to an adhesive sheet, followed by being arranged to each step of cutting (dicing) into small element pieces, drawing (expanding) of the adhesive sheet, peeling (picking up) the small element pieces from the adhesive sheet, and the like. The adhesive sheet (dicing tape) used in these steps is desired to have sufficient tack strength for the cut small element pieces (chips) in the dicing step while having reduced tack strength to cause no adhesive transfer in the picking up step.

Such an adhesive sheet includes a sheet made by applying an adhesive layer that develops polymerization curing reaction by ultraviolet rays and the like on a substrate film transmissive to activating rays, such as ultraviolet rays and/or electron beams. Using such an adhesive sheet, a method of irradiating the adhesive layer with ultraviolet rays and the like after the dicing step for polymerization curing of the adhesive layer to reduce the tack strength, followed by picking up the cut chip is employed.

As examples of such an adhesive sheet, PTLs 1 and 2 disclose adhesive sheets with a substrate surface on which an adhesive is applied containing a compound (polyfunctional oligomer), for example, capable of being three dimensionally networked by activating rays and having a photopolymerizable unsaturated double bond in a molecule.

CITATION LIST

Patent Literature

PTL 1: JP 2006-049509A
PTL 2: JP 2007-246633A

SUMMARY OF THE INVENTION

Technical Problem

In the step of dicing a semiconductor wafer or a substrate, a high speed rotating thin grinding wheel called as a blade scrapes up the adhesive of the adhesive sheet, causing attachment of the adhesive to the sides of diced chips, which sometimes results in yield reduction.

It is thus a main object of the present invention to provide an adhesive sheet that is capable of inhibiting scraping up of an adhesive in the dicing step, does not cause chip detachment during dicing processing, facilitates picking up, and does not readily develop adhesive transfer.

Solution to Problem

According to the present invention, an adhesive sheet is provided that includes a substrate film and an adhesive layer laminated on the film, wherein
the adhesive layer contains 100 parts by mass of a (meth)acrylate copolymer, from 5 to 250 parts by mass of a photopolymerizable compound, from 20 to 160 parts by mass of a softener, from 0.1 to 30 parts by mass of a curing agent, and from 0.1 to 20 parts by mass of a photopolymerization initiator, and
the photopolymerizable compound has a weight average molecular weight from 40,000 to 220,000.

In the adhesive sheet, the photopolymerizable compound is preferably urethane acrylate oligomer.

In the adhesive sheet, the photopolymerizable compound preferably has 10 or more functional groups each having an unsaturated double bond.

Preferably, the softener is polyester acrylate.

Preferably, a method of manufacturing an electronic component is provided that includes:
(a) bonding the adhesive sheet of any one of claims 1 to 4 to a ring frame and a semiconductor wafer or a substrate;
(b) dicing the semiconductor wafer or the substrate to make semiconductor chips or semiconductor components;
(c) light irradiation by irradiating the adhesive sheet with an activating ray;
(d) expanding by drawing the adhesive sheet to enlarge a gap between the semiconductor chips or the semiconductor components; and
(e) picking up the semiconductor chips or the semiconductor components from the adhesive sheet.

Preferably, the electronic component is a package using a resin, ceramic, or metal.

Advantageous Effects of Invention

The present invention provides an adhesive sheet that is capable of inhibiting scraping up of an adhesive in the dicing step, does not cause chip detachment during dicing processing, facilitates picking up, and does not readily develop adhesive transfer.

DESCRIPTION OF EMBODIMENTS

Descriptions are given below to preferred embodiments to carry out the present invention. The embodiments described below are examples of representative embodiments of the present invention, and the scope of the present invention is not limited by them.

An adhesive sheet according to the present invention is an adhesive sheet including a substrate film and an adhesive layer laminated on the film, wherein
the adhesive layer contains 100 parts by mass of a (meth)acrylate copolymer, from 5 to 250 parts by mass of a photopolymerizable compound, from 20 to 160 parts by mass of a softener, from 0.1 to 30 parts by mass of a curing agent, and from 0.1 to 20 parts by mass of a photopolymerization initiator, and the photopolymerizable compound has a weight average molecular weight from 40,000 to 220,000.

<Adhesive Layer>

A photocurable adhesive constituting the adhesive layer contains 100 parts by mass of a (meth)acrylate copolymer, from 5 to 250 parts by mass of a photopolymerizable compound, from 20 to 160 parts by mass of a softener, from 0.1 to 30 parts by mass of a curing agent, and from 0.1 to 20 parts by mass of a photopolymerization initiator, and the photopolymerizable compound has a weight average molecular weight from 40,000 to 220,000.

((Meth)Acrylate Copolymer)

The (meth)acrylate copolymer include polymers obtained by polymerizing acrylic acid, methacrylic acid, and an ester monomer thereof and copolymers obtained by copolymerizing such a monomer and an unsaturated monomer (e.g., vinyl acetate, styrene, acrylonitrile) copolymerizable with the monomer. In the adhesive sheet of the present embodiment, the adhesive constituting the adhesive layer is preferably an acrylic polymer that facilitates design of tack strength, and containing of the curing agent enables more precise adjustment of the tack strength. At least one acrylic monomer constituting the acrylic polymer preferably contains a functional group containing monomer. The functional group containing monomer is preferably blended in 0.01 mass % or more and 10 mass % or less in the acrylic polymer for polymerization. The functional group containing monomer is blended at a ratio of 0.01 mass % or more for sufficiently strong tack strength to an adherend, tending in inhibition of water entering into a gap between the adherend and adhesive sheet. The functional group containing monomer is blended at a ratio of 10 mass % or less for not too high tack strength to an adherend, tending to allow inhibition of adhesive transfer.

Examples of a main monomer in the acrylic polymer include (meth)acrylic monomers, such as butyl (meth)acrylate, 2-butyl (meth)acrylate, t-butyl (meth)acrylate, pentyl (meth)acrylate, octyl (meth)acrylate, 2-ethylhexyl (meth)acrylate, nonyl (meth)acrylate, decyl (meth)acrylate, lauryl (meth)acrylate, methyl (meth)acrylate, ethyl (meth)acrylate, isopropyl (meth)acrylate, tridecyl (meth)acrylate, myristyl (meth)acrylate, cetyl (meth)acrylate, stearyl (meth)acrylate, cyclohexyl (meth)acrylate, and benzyl (meth)acrylate.

Such an acrylic monomer is particularly preferably one having a monomer containing a functional group at least in part. Such a monomer containing a functional group preferably includes monomers having a hydroxyl group, a carboxyl group, an epoxy group, an amide group, an amino group, a methylol group, a sulfonic acid group, a sulfamic acid group, and a phosphoric (phosphorous) ester group. Among all, a vinyl compound having a functional group is particularly preferred and a vinyl compound having a hydroxyl group is more preferred. The vinyl compound in this context contains acrylate described later.

The functional group containing monomer having a hydroxyl group include, for example, 2-hydroxyethyl (meth)acrylate, 2-hydroxypropyl (meth)acrylate, and 2-hydroxybutyl (meth)acrylate.

Examples of the monomer having a carboxyl group include (meth)acrylic acid, crotonic acid, maleic acid, itaconic acid, fumaric acid, acrylamide N-glycolic acid, cinnamic acid, and the like.

Examples of the monomer having an epoxy group include allyl glycidyl ether, glycidyl ether (meth)acrylate, and the like.

Examples of the monomer having an amide group include (meth)acrylamide and the like.

Examples of the monomer having an amino group include N,N-dimethylaminoethyl (meth)acrylate and the like.

Examples of the monomer having a methylol group include N-methylolacrylamide and the like.

In the adhesive layer of the present embodiment after the acrylic polymer is reacted with the curing agent to cure the adhesive layer, the monomer containing a carboxyl group that constitutes the acrylic polymer is preferably is from 0.1 to 10 mass % in the acrylic polymer. That is, in other words, in the functional group containing monomers having an adhesive reacted with a curing agent, the functional group containing monomer containing a carboxyl group is preferably 10 mass % or less. Use of the functional group containing monomer containing a carboxyl group increases tack strength to metal. In the case of more than 10 mass % of the functional group containing monomer containing a carboxyl group after being reacted with a curing agent, the tack strength to metal is high and adhesive transfer tends to occur. The monomer is thus preferred to be 10 mass % or less. The monomer having a carboxyl group preferably readily disappears by reaction with a curing agent. For example, (meth)acrylic acid, crotonic acid, maleic acid, itaconic acid, fumaric acid, acrylamide N-glycolic acid, and cinnamic acid are preferably used.

(Curing Agent)

In the adhesive sheet of the present embodiment, the adhesive used for the adhesive layer is preferably blended with a curing agent. The curing agent is blended at a ratio of 0.1 parts by mass or more and 30 parts by mass or less based on 100 parts by mass of the acrylic polymer and preferably 1 part by mass or more and 20 parts by mass or less. The curing agent blended at a ratio of 0.1 parts by mass or more and 30 parts by mass or less is capable of inhibiting adhesive transfer.

The curing agent blended in the photocurable adhesive includes polyfunctional isocyanate curing agents, polyfunctional epoxy curing agents, azirine compounds, melamine compounds, and the like, and is preferably a polyfunctional isocyanate curing agent or a polyfunctional epoxy curing agent. Use of the polyfunctional epoxy curing agent or the polyfunctional isocyanate curing agent in at least part of the above curing agent enables selective reaction with the functional group containing monomer having a carboxyl group for disappearance of the monomer. The use also enables adjustment of the amount of the functional group containing monomer having a carboxyl group after curing.

The polyfunctional isocyanate curing agent includes, for example, aromatic polyisocyanate curing agents, aliphatic polyisocyanate curing agents, and alicyclic polyisocyanate curing agents.

Examples of the aromatic polyisocyanate include, but not particularly limited to, 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, 2,4,6-triisocyanate toluene, 1,3,5-triisocyanate benzene, dianisidine diisocyanate, 4,4'-diphenyl ether diisocyanate, 4,4',4"-triphenylmethane triisocyanate, ω,ω'-diisocyanate-1,3-dimethylbenzene, ω,ω'-diisocyanate-1,4-dimethylbenzene, ω,ω'-diisocyanate-1,4-diethylbenzene, 1,4-tetramethylxylylene diisocyanate, 1,3-tetramethylxylylene diisocyanate, and the like.

Examples of the aliphatic polyisocyanate include, but not particularly limited to, trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate, 2,4,4-trimethylhexamethylene diisocyanate, and the like.

Examples of the alicyclic polyisocyanate include, but not particularly limited to, 3-isocyanate methyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylenebis(cyclohexyl isocyanate), 1,4-bis(isocyanate methyl)cyclohexane, and 1,4-bis(isocyanate methyl)cyclohexane.

Among the polyisocyanates, preferably used ones are 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, and hexamethylene diisocyanate.

The polyfunctional epoxy curing agent is a compound mainly having two or more epoxy groups and one or more tertiary nitrogen atoms. Examples of this curing agent include N,N-glycidyl aniline, N,N-glycidyl toluidine, m-N,N-glycidyl aminophenyl glycidyl ether, p-N,N-glycidyl aminophenyl glycidyl ether, triglycidyl isocyanurate, N,N,N',N'-tetraglycidyl diaminodiphenylmethane, N,N,N',N'-tetraglycidyl-m-xylylenediamine, N,N,N',N',N"-pentaglycidyl diethylene triamine, and the like.

(Photopolymerizable Compound)

As the photopolymerizable compound, urethane acrylate oligomer is used. The urethane acrylate oligomer is produced by reacting (meth)acrylate having a hydroxy group with a terminal isocyanate urethane prepolymer obtained by reacting a polyisocyanate compound with a polyol compound of polyester type, polyether type, or the like.

Examples of such a polyisocyanate compound include 2,4-tolylene diisocyanate, 2,6-tolylene diisocyanate, 1,3-xylene diisocyanate, 1,4-xylene diisocyanate, diphenylmethane 4,4-diisocyanate, trimethylhexamethylene diisocyanate, hexamethylene diisocyanate, isophorone diisocyanate, and the like. Examples of such (meth)acrylate having a hydroxy group include 2-hydroxyethyl (meth)acrylate, 2-hydroxypropyl (meth)acrylate, polyethylene glycol (meth)acrylate, pentaerythritol triacrylate, glycidol di(meth)acrylate, dipentaerythritol monohydroxypentaacrylate, and the like.

A preferred photopolymerizable compound is urethane acrylate oligomer having 10 or more and 15 or less functional groups each having an unsaturated double bond because of good curing of the adhesive after irradiation with light, such as ultraviolet rays.

The photopolymerizable compound has a weight average molecular weight from 40,000 to 220,000 and preferably from 80,000 to 120,000. The photopolymerizable compound having a smaller weight average molecular weight tends to cause more scraping up of the adhesive during dicing, whereas the one having a larger weight average molecular weight does not result in tack strength and tends to cause detachment of chips during dicing.

The photopolymerizable compound is blended in an amount from 5 to 200 parts by mass based on 100 parts by mass of the (meth)acrylate copolymer and preferably from 40 to 200 parts by mass. A smaller amount of the photopolymerizable compound causes reduction of peelability of the adhesive sheet after radiation exposure and tends to cause semiconductor chip pickup failures. In contrast, a greater amount of the photopolymerizable compound causes excessive reduction of tack strength due to the light irradiation step to loosen the chips in the picking up step, which results in reduction of productivity.

(Softener)

To soften the adhesive and increase the tack strength to a rough surface, a softener may be added.

As such a softener, polyester acrylate is used. Polyester acrylate having an unsaturated double-bonded functional group forms crosslinking reaction by irradiation with light, such as ultraviolet rays, to allow inhibition of contamination to the adherend.

Such polyester acrylate is produced by esterification of polyester polyol, obtained by reacting polyol with polybasic acid, and acrylic acid or methacrylic acid. The polyol includes, for example, ethylene glycol, polyethylene glycol, propylene glycol, polypropylene glycol, neopentyl glycol, 1,4-butanediol, and the like. The polybasic acid includes, for example, succinic acid, adipic acid, sebacic acid, phthalic acid, isophthalic acid, terephthalic acid, trimellitic acid, and the like.

Such polyester acrylate preferably has one or more and three or less unsaturated double bonded functional groups each having an unsaturated double bond. More unsaturated double bonded functional groups cause excessive progress in curing of the adhesive after irradiation with light, such as ultraviolet rays, resulting in poor close-adhesion to the substrate.

The softener is preferably blended at a ratio of 20 parts by mass or more and 160 parts by mass or less based on 100 parts by mass of the (meth)acrylate copolymer and more preferably 40 parts by mass or more and 140 parts by mass or less. The softener blended 20 parts by mass or more enables plasticization of the adhesive, which increases tack strength to a rough surface to maintain semiconductor chip retentivity during dicing, whereas the softener blended 160 parts by mass or less enables inhibition of adhesive transfer to the semiconductor chips due to scraping up of the adhesive during dicing.

(Photopolymerization Initiator)

The photopolymerization initiator includes benzoin, benzoin alkyl ethers, acetophenones, anthraquinones, thioxanthones, ketals, benzophenones, xanthones, and the like.

Examples of such benzoin include benzoin, benzoin methyl ether, benzoin ethyl ether, benzoin propyl ether, and the like.

Examples of such acetophenones include benzoin alkyl ethers, acetophenone, 2,2-dimethoxy-2-acetophenone, 2,2-diethoxy-2-acetophenone, 1,1-dichloroacetophenone, and the like.

Examples of such anthraquinones include 2-methylanthraquinone, 2-ethylanthraquinone, 2-tertiary butyl anthraquinone, 1-chloroanthraquinone, and the like.

Examples of such thioxanthones include 2,4-dimethylthioxanthone, 2,4-diisopropylthioxanthone, 2-chlorothioxanthone, 2,4-diisopropylthioxanthone, and the like.

Examples of such ketals include acetophenone dimethyl ketal, benzyl dimethyl ketal, benzyl diphenyl sulfide, tetramethylthiuram monosulfide, azobisisobutyronitrile, dibenzyl, diacetyl, β-chloranthraquinone, and the like.

The photopolymerization initiator is blended in an amount of 0.1 parts by mass or more and 20 parts by mass or less based on 100 parts by mass of the (meth)acrylate polymer, and preferably 1 part by mass or more and 10 parts by mass or less. A too small amount causes reduction in peelability of the adhesive sheet after radiation exposure and tends to cause semiconductor chip pickup failures. In contrast, a too large amount causes the photopolymerization initiator to bleed out to an adhesive surface, resulting in contamination.

The photopolymerization initiator may be combined with one or more conventionally known photopolymerization accelerators as needed. As such photopolymerization accelerators, benzoic acids, tertiary amine, and the like may be used. Examples of the tertiary amine include triethylamine, tetraethylpentaamine, dimethylamino ether, and the like.

(Tackifying Resin)

A tackifying resin may be added to the adhesive. Such a tackifying resin includes a terpene phenol resin obtained by fully or partially hydrogenating a terpene phenol resin.

The terpene phenol resin is produced by reacting, for example, 1 mol of a terpene compound with from 0.1 to 50 moles of phenols.

Examples of the terpene compound include myrcene, allo-ocimene, ocimene, α-pinene, β-pinene, dipentene, limonene, α-phellandrene, α-terpinen, γ-terpinen, terpinolene, 1,8-cineole, 1,4-cineole, α-terpineol, β-terpineol, γ-terpineol, camphene, tricyclene, sabinene, paramenthadienes, carenes, and the like. Among these compounds, α-pinene, β-pinene, limonene, myrcene, allo-ocimene, and α-terpinen are particularly preferably used in the present invention.

Examples of the phenols include, but not limited to, phenol, cresol, xylenol, catechol, resorcin, hydroquinone, bisphenol A, and the like.

A ratio of phenols in the terpene phenol resin is, but not limited to, approximately from 25 to 50 mol %.

The fully or partially hydrogenated terpene phenol resin preferably has a hydroxyl value from 50 to 250. This is because hydroxyl value less than 50 causes insufficient reaction with the isocyanate curing agent to bleed out to the adhesive surface and result in contamination, whereas the value more than 250 causes an increase in viscosity and non-uniform mixing with the (meth)acrylate copolymer and the like, leading to unstable pickup characteristics.

Examples of the hydrogenation method include, but not particularly limited to, a method that uses, as a catalyst, noble metal, such as palladium, ruthenium, and rhodium, or those supporting such noble metal on a carrier, such as activated carbon, activated alumina, and diatomaceous earth. The hydrogenation rate may be measured by bromine number measurement, iodine number measurement, and the like.

The fully or partially hydrogenated terpene phenol resin preferably has a hydrogenation rate of 30 mol % or more and more preferably 70 mol % or more. This is because the rate less than 30 mol % causes inhibition of reaction of the photopolymerizable compound by irradiation with activating rays not to sufficiently reduce tack strength and reduce pickup performance.

The fully or partially hydrogenated terpene phenol resin is preferably blended at a ratio of 0.5 parts by mass or more and 100 parts by mass or less based on 100 parts by mass of the (meth)acrylate copolymer and more preferably 1.0 parts by mass or more and 50 parts by mass or less. The fully or partially hydrogenated terpene phenol resin in 0.5 parts by mass or more causes not too low tack strength to maintain semiconductor chip retentivity during dicing, whereas the resin in 100 parts by mass or less is capable of inhibiting pickup failures.

(Additives, etc.)

To the adhesive, various additives may be added, such as a softening agent, an antioxidant, a filler, a conducting agent, an ultraviolet absorber, and a light stabilizer, for example.

The adhesive layer preferably has a thickness of 1 μm or more and 50 μm or less and particularly preferably 5 μm or more and 35 μm or less. A too thick adhesive layer causes too high tack strength to reduce the pickup performance. A too thin adhesive layer causes too low tack strength to reduce the chip retentivity during dicing and sometimes cause peeling between the ring frame and the sheet.

(Substrate Film)

Examples of the material for the substrate film include polyvinyl chloride, polyethylene terephthalate, an ethylene-vinyl acetate copolymer, an ethylene-acrylic acid-acrylate film, an ethylene-ethyl acrylate copolymer, polyethylene, polypropylene, a propylene-based copolymer, an ethylene-acrylic acid copolymer, and an ionomer resin obtained by crosslinking an ethylene-(meth)acrylic acid copolymer, an ethylene-(meth)acrylic acid-(meth)acrylate copolymer, or the like with metal ions. The substrate film may be a mixture or a copolymer of such a resin or may be a laminate of films or sheets made of such a resin.

As a material for the substrate film, an ionomer resin is preferably used. Among ionomer resins, use of ionomer resins obtained by crosslinking a copolymer having an ethylene unit, an acrylic acid unit, and a (meth)acrylic acid alkyl ester unit with metal ions, such as Na+, K+, and Zn2+ results in a significant cut waste inhibition effect and thus use of them is preferred.

The substrate may be a single layer or multilayer film or sheet of the above material or may be a lamination of films and the like of different materials. The substrate has a thickness from 50 to 200 μm and preferably from 70 to 150 μm.

The substrate is preferably subjected to antistatic treatment. Such antistatic treatment includes treatment to blend an antistatic agent in the substrate, treatment to apply an antistatic agent on a substrate surface, and treatment by corona discharge.

As such an antistatic agent, for example, a quaternary amine salt monomer and the like may be used. Examples of the quaternary amine salt monomer include dimethylaminoethyl (meth)acrylate quaternary chloride, diethylaminoethyl (meth)acrylate quaternary chloride, methylethylaminoethyl (meth)acrylate quaternary chloride, p-dimethylaminostyrene quaternary chloride, and p-diethylaminostyrene quaternary chloride. Among them, dimethylaminoethyl methacrylate quaternary chloride is preferred.

Examples of the method of using a lubricant and the antistatic agent include, but not particularly limited to, applying the adhesive on one side of the substrate film and the lubricant and/or the antistatic agent on the back side and kneading the lubricant and/or the antistatic agent into the resin for the substrate film to be made into a sheet.

The substrate film may have one side laminated with the adhesive and the other side as an embossed surface with average surface roughness (Ra) from 0.3 to 1.5 μm. The embossed surface is placed on a machine table side of an expander to readily expand the substrate film in an expanding step after dicing.

(Lubricant)

To improve expandability after dicing, a lubricant may be applied on an adhesive-noncontact surface of the substrate film or may knead a lubricant into the substrate film.

The lubricant is not particularly limited as long as it reduces a coefficient of friction between the adhesive sheet and the expander, and examples of the lubricant include a silicone compound, such as a silicone resin and (modified) silicone oil, a fluorine resin, hexagonal boron nitride, carbon black, molybdenum disulfide, and the like. These friction reducing agents may be produced by mixing a plurality of components. Since electronic components may be produced in a clean room, a silicone compound or a fluorine resin is preferably used. Among silicone compounds, copolymers having a silicone macromonomer unit particularly have good compatibility with an antistatic layer to balance the antistatic properties and the expandability and thus they are preferably used.

Specific steps in a method of manufacturing an electronic component according to the present invention are described in order.

(1) Bonding Step

First, in a bonding step, the adhesive sheet is bonded to the ring frame and the semiconductor wafer or the substrate. The wafer may be a conventional for general purpose wafer, such as a silicon wafer, a gallium nitride wafer, a silicon carbide wafer, and a sapphire wafer. The substrate may be a general purpose substrate, such as a package substrate having a chip sealed with a resin, an LED package substrate, and a ceramic substrate.

(2) Dicing Step

In the dicing step, the silicon wafer or the like is diced to make semiconductor chips or semiconductor components.

(3) Light Irradiation Step

In a light irradiation step, the photocurable adhesive layer is irradiated with activating rays, such as ultraviolet rays, from the substrate side. As a light source for such ultraviolet rays, a low pressure mercury lamp, a high pressure mercury lamp, an ultra-high pressure mercury lamp, a metal halide lamp, and the like may be used. Instead of the ultraviolet rays, electron beams may be used, and as a light source for electron beams, $\alpha$ rays, $\beta$ rays, and $\gamma$ rays may be used.

The adhesive layer is three dimensionally networked by being irradiated with light for curing to reduce the tack strength of the adhesive layer. Here, as described above, the adhesive sheet according to the present invention does not excessively closely adhere to a wafer or the like even under heating, and thus the adhesion strength is sufficiently reduced by irradiation with activating rays or the like.

(4) Expanding and Picking Up Step

In an expanding and picking up step, to enlarge the gap between the semiconductor chips or the semiconductor components, the adhesive sheet is drawn and a needle pin or the like is used for pushing up of the chips or components. The chips or components are then adsorbed by a vacuum collet, a vacuum pickup instrument, or the like to be peeled from the adhesive layer of the adhesive sheet for picking up. At this point, in the adhesive sheet according to the present invention, the adhesion strength is sufficiently reduced by the irradiation with ultraviolet rays and the like. Peeling between the adhesive layer and the chip or component is thus facilitated to obtain good pickup performance and not to cause failures, such as an adhesive transfer.

Production of Adhesive Sheet

The method of forming an adhesive layer on a substrate film to make an adhesive sheet include, for example, a method to directly apply the adhesive on the substrate film by a coater, such as a gravure coater, a comma coater, a bar coater, a knife coater, and a roll coater, and a method to apply/dry an adhesive on a release film, followed by bonding to the substrate film. The adhesive may be printed on the substrate film by anastatic printing, intaglio printing, planographic printing, flexographic printing, offset printing, screen printing, or the like.

The adhesive sheet of the present invention is preferably used for bonding of an electronic component assembly called a workpiece in the dicing step and a back grinding step in a procedure of manufacturing an electronic component.

Examples and Comparative Examples

Photocurable adhesives and adhesive sheets according to Examples and Comparative Examples were produced in the following formula. Tables 1 and 2 indicate main composition and results of each experimental example.

A photocurable adhesive was applied on a separator film made of polyethylene terephthalate to cause the adhesive layer after drying to have a thickness of 20 μm. The adhesive layer was laminated to a substrate film and aged at 40° C. for 7 days to obtain an adhesive sheet. As the substrate film, a film (model: HM1855 produced by DuPont-Mitsui Polychemicals Co., Ltd) was used that had Zn salt of an ethylene-methacrylic acid-alkyl methacrylate copolymer, which is an ionomer resin, as a main component, an MFR value of 1.0 g/10 min. (JIS K7210, 210° C.), and a melting point of 86° C., contained $Zn^{2+}$ ion, and was formed by T die extrusion to have a thickness of 150 μm.

(Photocurable Adhesive)

(Meth)Acrylate Copolymer

A-1: a copolymer of 60 mass % of methyl acrylate, 35 mass % of 2-ethylhexylacrylate, 4.5 mass % of acrylic acid, and 0.5 mass % of 2-hydroxyethyl acrylate, having a weight average molecular weight of 200 thousand, obtained by solution polymerization.

A-2: a copolymer of 54% of ethyl acrylate, 19% of butyl acrylate, and 24% of methoxyethyl acrylate, having a weight average molecular weight of 2 million, and obtained by emulsion polymerization.

Photopolymerizable Compound

The compound was prepared by reacting hydroxyl group containing acrylate containing dipentaerythritol pentaacrylate as a main component with a trimer of isophorone diisocyanate as isocyanate in a known method disclosed in, JP 61-42529A, JP 2012-36253, or the like. It was urethane acrylate (synthetic product) having 15 functional groups each having an unsaturated double bond. The weight average molecular weight was measured by gel permeation chromatography (GPC) as a weight average molecular weight on the basis of polystyrene. Specifically, Apparatus: GPC-8020 SEC system (manufactured by Tosoh Corp.);

Column: TSK Guard HZ-L+HZM-N 6.0×150 mm×3;

Flow Rate: 0.5 ml/min;

Detector: RI-8020;

Concentration: 0.2 wt/Vol %;

Injected Amount: 20 μL;

Column Temperature: 40° C.;

System Temperature: 40° C.;

Solvent: THF;

Calibration Curve: generated using standard polystyrene (produced by PL) and the weight average molecular weight (Mw) was represented on the basis of polystyrene.

The results were:

B-1: a weight average molecular weight of 11,000;

B-2: a weight average molecular weight of 43,000;

B-3: a weight average molecular weight of 79,000;

B-4: a weight average molecular weight of 124,000;

B-5: a weight average molecular weight of 217,000; and

B-6: a weight average molecular weight of 338,000.

Softener

X-1: polyester acrylate having a weight average molecular weight of 8,000 and produced by reacting polyester polyol, obtained by reacting ethylene glycol with succinic acid, with acrylic acid.

X-2: polyester acrylate having a weight average molecular weight of 5,000 and produced by reacting polyester polyol, obtained by reacting propylene glycol with trimellitic acid, with methacrylic acid.

Curing Agent

C-1: Coronate L-45E produced by Nippon Polyurethane Industry Co., Ltd.; trimethylolpropane adduct of 2,4-tolylene diisocyanate.

C-2: Coronate HL produced by Nippon Polyurethane Industry Co., Ltd.; trimethylolpropane adduct of hexamethylene diisocyanate Photopolymerization Initiator D-1: IRGACURE 184 produced by BASF Japan Ltd.; 2-hydroxycyclohexyl phenyl keton.

D-2: IRGACURE 651 produced by BASF Japan Ltd.; benzyl dimethyl ketal.

TABLE 1

| | | | Examples |||||||||||||| 
| | | | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|---|
| Photocurable Adhesive | (Meth)Acrylate Copolymer | A-1 | 100 | 100 | 100 | 100 | 100 | 100 | 100 | 100 | 100 | 100 | 100 | 100 | 100 | 100 |
| | | A-2 | | | | | | | | | | | | | | |
| | Photopolymerizable Compound | B-1: Mw 11,000 | | | | | | | | | | | | | | |
| | | B-2: Mw 43,000 | 100 | | | | | | | | | | | | | |
| | | B-3: Mw 79,000 | | | 100 | | | 5 | 40 | 200 | 250 | | | | 100 | 100 |
| | | B-4: Mw 124,000 | | | | 100 | | | | | | 5 | 40 | 200 | 250 | |
| | | B-5: Mw 217,000 | | | | | 100 | | | | | | | | | |
| | | B-6: Mw 338,000 | | | | | | | | | | | | | | |
| | Softener | X-1 | 90 | 90 | 90 | 90 | 90 | 90 | 90 | 90 | 90 | 90 | 90 | 90 | 20 | 40 |
| | | X-2 | | | | | | | | | | | | | | |
| | Curing Agent | C-1 | 5 | 5 | 5 | 5 | 5 | 5 | 5 | 5 | 5 | 5 | 5 | 5 | 5 | 5 |
| | | C-2 | | | | | | | | | | | | | | |
| | Photopolymerization Initiator | D-1 | 3 | 3 | 3 | 3 | 3 | 3 | 3 | 3 | 3 | 3 | 3 | 3 | 3 | 3 |
| | | D-2 | | | | | | | | | | | | | | |
| Evaluation | Scraping Up of Adhesive | | ○ | ⊙ | ⊙ | ⊙ | ⊙ | ⊙ | ⊙ | ⊙ | ○ | ⊙ | ⊙ | ⊙ | ○ | ⊙ | ⊙ |
| | Chip Retentivity | | ⊙ | ⊙ | ⊙ | ○ | ○ | ⊙ | ⊙ | ⊙ | ⊙ | ⊙ | ⊙ | ⊙ | ⊙ | ○ | ⊙ |
| | Pickup Performance | | ⊙ | ⊙ | ⊙ | ⊙ | ⊙ | ○ | ⊙ | ⊙ | ⊙ | ○ | ⊙ | ⊙ | ⊙ | ⊙ | ⊙ |
| | Contamination Properties | | ⊙ | ⊙ | ⊙ | ⊙ | ⊙ | ⊙ | ⊙ | ⊙ | ○ | ⊙ | ⊙ | ⊙ | ○ | ⊙ | ⊙ |
| | Loosening of Chips | | ⊙ | ⊙ | ⊙ | ○ | ⊙ | ⊙ | ⊙ | ⊙ | ⊙ | ⊙ | ⊙ | ⊙ | ○ | ○ | ⊙ |
| | Overall Evaluation | | ○ | ⊙ | ⊙ | ○ | ○ | ○ | ⊙ | ⊙ | ○ | ○ | ⊙ | ⊙ | ○ | ○ | ⊙ |

| | | | Examples |||||||||||||| 
| | | | 15 | 16 | 17 | 18 | 19 | 20 | 21 | 22 | 23 | 24 | 25 | 26 | 27 | 28 |
|---|---|---|---|---|---|---|---|---|---|---|---|---|---|---|---|---|
| Photocurable Adhesive | (Meth)Acrylate Copolymer | A-1 | 100 | 100 | 100 | 100 | 100 | 100 | 100 | 100 | 100 | 100 | | 100 | 100 | 100 |
| | | A-2 | | | | | | | | | | | 100 | | | |
| | Photopolymerizable Compound | B-1: Mw 11,000 | | | | | | | | | | | | | | |
| | | B-2: Mw 43,000 | | | | | | | | | | | | | | |
| | | B-3: Mw 79,000 | 100 | 100 | 100 | 100 | 100 | 100 | 100 | 100 | 100 | 100 | 100 | 100 | 100 | 100 |
| | | B-4: Mw 124,000 | | | | | | | | | | | | | | |
| | | B-5: Mw 217,000 | | | | | | | | | | | | | | |
| | | B-6: Mw 338,000 | | | | | | | | | | | | | | |
| | Softener | X-1 | 140 | 160 | 90 | 90 | 90 | 90 | 90 | 90 | 90 | 90 | 90 | | 90 | 90 |
| | | X-2 | | | | | | | | | | | | 90 | | |
| | Curing Agent | C-1 | 5 | 5 | 0.1 | 1 | 20 | 30 | 5 | 5 | 5 | 5 | 5 | 5 | 5 | |
| | | C-2 | | | | | | | | | | | | | | 5 |
| | Photopolymerization Initiator | D-1 | 3 | 3 | 3 | 3 | 3 | 3 | 0.1 | 1 | 10 | 20 | 3 | 3 | | 3 |
| | | D-2 | | | | | | | | | | | | | 3 | |
| Evaluation | Scraping Up of Adhesive | | ⊙ | ○ | ⊙ | ⊙ | ⊙ | ⊙ | ⊙ | ⊙ | ⊙ | ⊙ | ⊙ | ⊙ | ⊙ | ⊙ |
| | Chip Retentivity | | ⊙ | ⊙ | ⊙ | ⊙ | ⊙ | ○ | ⊙ | ⊙ | ⊙ | ⊙ | ⊙ | ⊙ | ⊙ | ⊙ |
| | Pickup Performance | | ⊙ | ○ | ⊙ | ⊙ | ⊙ | ⊙ | ○ | ⊙ | ⊙ | ⊙ | ⊙ | ⊙ | ⊙ | ⊙ |
| | Contamination Properties | | ⊙ | ○ | ⊙ | ⊙ | ⊙ | ⊙ | ⊙ | ⊙ | ⊙ | ⊙ | ⊙ | ○ | ⊙ | ⊙ |
| | Loosening of Chips | | ⊙ | ⊙ | ⊙ | ⊙ | ⊙ | ○ | ⊙ | ⊙ | ⊙ | ⊙ | ⊙ | ⊙ | ⊙ | ⊙ |
| | Overall Evaluation | | ⊙ | ○ | ⊙ | ⊙ | ⊙ | ○ | ○ | ⊙ | ⊙ | ⊙ | ⊙ | ○ | ⊙ | ⊙ |

TABLE 2

|  |  |  | Comparative Examples | | | | | | | | | | | |
|---|---|---|---|---|---|---|---|---|---|---|---|---|---|---|
|  |  |  | 1 | 2 | 3 | 4 | 5 | 6 | 7 | 8 | 9 | 10 | 11 | 12 |
| Photocurable Adhesive | (Meth)Acrylate Copolymer | A-1 | 100 | 100 | 100 | 100 | 100 | 100 | 100 | 100 | 100 | 100 | 100 | 100 |
|  |  | A-2 |  |  |  |  |  |  |  |  |  |  |  |  |
|  | Photopolymerizable Compound | B-1: Mw 11,000 | 100 |  |  |  |  |  |  |  |  |  |  |  |
|  |  | B-2: Mw 43,000 |  |  |  |  |  |  |  |  |  |  |  |  |
|  |  | B-3: Mw 79,000 |  | 1 | 300 |  |  |  | 100 | 100 | 100 | 100 | 100 | 100 |
|  |  | B-4: Mw 124,000 |  |  |  | 1 | 300 |  |  |  |  |  |  |  |
|  |  | B-5: Mw 217,000 |  |  |  |  |  |  |  |  |  |  |  |  |
|  |  | B-6: Mw 338,000 |  |  |  |  |  | 100 |  |  |  |  |  |  |
|  | Softener | X-1 | 90 | 90 | 90 | 90 | 90 | 90 | 10 | 180 | 90 | 90 | 90 | 90 |
|  |  | X-2 |  |  |  |  |  |  |  |  |  |  |  |  |
|  | Curing Agent | C-1 | 5 | 5 | 5 | 5 | 5 | 5 | 5 | 5 | 0.05 | 35 | 5 | 5 |
|  |  | C-2 |  |  |  |  |  |  |  |  |  |  |  |  |
|  | Photopolymerization Initiator | D-1 | 3 | 3 | 3 | 3 | 3 | 3 | 3 | 3 | 3 | 3 | 0.05 | 25 |
|  |  | D-2 |  |  |  |  |  |  |  |  |  |  |  |  |
| Evaluation | Scraping Up of Adhesive |  | X | ⊙ | ○ | ⊙ | ○ | ⊙ | ⊙ | X | ⊙ | ⊙ | ⊙ | ⊙ |
|  | Chip Retentivity |  | ⊙ | X | ⊙ | X | ⊙ | X | X | ⊙ | ○ | X | ⊙ | X |
|  | Pickup Performance |  | ⊙ | X | ⊙ | X | ⊙ | ⊙ | ⊙ | X | X | ⊙ | X | ⊙ |
|  | Contamination Properties |  | ⊙ | ⊙ | ○ | ⊙ | X | ⊙ | ⊙ | X | X | ○ | ⊙ | X |
|  | Loosening of Chips |  | ○ | ⊙ | X | ⊙ | X | X | X | ⊙ | ⊙ | ○ | ⊙ | ○ |
|  | Overall Evaluation |  | X | X | X | X | X | X | X | X | X | X | X | x |

(1) Evaluation on Scraping Up of Adhesive, Chip Retentivity, and Pickup Performance The adhesive sheet thus obtained was bonded to a ceramic (alumina) material of a length of 80 mm×a width of 80 mm×a thickness of 0.6 mm and a ring frame. After that, each step of dicing and picking up was performed.

The dicing step was carried out in the following conditions.
Dicing Apparatus: DAD341 manufactured by DISCO Corp.
Dicing Blade: MD500-35YM030 manufactured by Tokyo Seimitsu Co., Ltd.
Dicing Blade Shape: outer diameter of 58 mm, blade width of 15 μm, inner diameter of 40 mm
Number of Dicing Blade Revolution: 30,000 rpm
Dicing Blade Feed Rate: 20 mm/sec.
Dicing Size: 5 mm square
Cutting Depth into Adhesive Sheet: 100 μm
Cutting Water Temperature: 25° C.
Amount of Cutting Water: 1.0 liter/min.

The picking up step was carried out in the following conditions.
Pickup Apparatus: CAP-300II manufactured by Canon Machinery Inc.
Amount of Expansion: 5 mm
Needle Pin Shape: 250 μmR
Number of Needle Pins: 4
Height of Pushing Up Needle Pins: 1.5 mm The following evaluation was made in the dicing step and the picking up step.

(1-1) Scraping Up of Adhesive

Scraping up of the adhesive was evaluated by observing the presence of the adhesive attached to each chip side of randomly selected 50 picked up chips with a 500-power microscope by the following criteria.
⊙ (excellent): no attachment of the adhesive to the chip side
○ (good): less than 5% of attachment of the adhesive to the chip side
x (poor): 5% or more attachment of the adhesive to the chip side (1-2) Chip Retentivity Chip retentivity was evaluated after the dicing step by the following criteria based on a residual ratio of the ceramic chips retained on the adhesive sheet.
⊙ (excellent): less than 5% of the chips were detached.
○ (good): 5% or more and less than 10% of the chips were detached.
x (poor): 10% or more of the chips were detached.

(1-3) Pickup Performance

Pickup performance was evaluated by the following criteria based on a rate of successfully picking up the ceramic chips in the picking up step.
⊙ (excellent): the chip pickup success rate was 95% or more.
○ (good): the chip pickup success rate was 80% or more and less than 95%.
x (poor): the chip pickup success rate was less than 80%.

(2) Contamination Properties

The adhesive sheet was bonded to a silicon mirror wafer, and 20 minutes later, irradiated with 150 mJ/cm² of ultraviolet rays with a high pressure mercury lamp, and then the adhesive sheet was peeled. The number of particles of 0.28 μm or more remained on the bonding surface of the silicon mirror wafer was measured by a particle counter.
Excellent: 500 or less particles
Good: 501 or more and 2000 or less particles
Poor: 2001 or more particles (3) Loosening of Chips Loosening of chips was evaluated by the following criteria based on a ratio of semiconductor chips adjacent to the semiconductor chip to be picked up loosened by impact of the pin pushup in the picking up step.
⊙ (excellent): less than 1% of the chips were loosened
○ (good): 1% or more and less than 3% of the chips were loosened
x (poor): 3% or more of the chips were loosened Consideration In all Examples, good results were obtained for all evaluation items. In contrast, in all Comparative Examples, a satisfactory result was not obtained for at least one evaluation item. In Comparative Example 1, the photopolymerizable compound had a too small weight average molecular weight, and thus scraping up of the adhesive readily occurred. In Comparative Examples 2 and 4, the photopolymerizable compound was blended in a too little amount, and thus the chip retentivity and the pickup performance were poor. In Comparative Examples 3 and 5, the photopolymerizable compound was blended in a too large amount, and thus the chips were readily loosened. In Comparative Example 5, the particles were prone to be remained on the wafer. In Comparative Example 6, the photopolymerizable compound had a too large weight average molecular weight, and thus the chip retentivity was poor and the chips were readily loosened. In Comparative Example 7, the softener was too little, and thus the chip retentivity was poor and the chips were readily loosened. In Comparative Example 8, the softener was too much, and thus the adhesive was readily scraped up, the pickup performance was poor, and the particles were prone to be remained on the wafer. In Comparative Example 9, the curing agent was blended in a too little amount, and thus the pickup performance was poor and the particles were prone to be remained on the wafer. In Comparative Example 10, the curing agent was blended in a too large amount, and thus the chip retentivity was poor. In Comparative Example 11, the photopolymerization initiator was blended in a too little amount, and thus the pickup performance was poor. In Comparative Example 12, the photopolymerization initiator was blended in a too large amount, and thus the chip retentivity was poor and the particles were prone to be remained on the wafer.

The invention claimed is:

1. An adhesive sheet comprising a substrate film and an adhesive layer laminated on the film, wherein
the adhesive layer contains 100 parts by mass of a (meth)acrylate copolymer, from 5 to 250 parts by mass of a photopolymerizable compound, from 20 to 160 parts by mass of a softener, from 0.1 to 30 parts by mass of a curing agent, and from 0.1 to 20 parts by mass of a photopolymerization initiator,
the photopolymerizable compound has a weight average molecular weight from 40,000 to 220,000, and
the softener is polyester acrylate.

2. The adhesive sheet of claim 1, wherein the photopolymerizable compound is urethane acrylate oligomer.

3. The adhesive sheet of claim 1, wherein the photopolymerizable compound has 10 or more functional groups each having an unsaturated double bond.

4. A method of manufacturing an electronic component, comprising:
 (a) bonding the adhesive sheet of claim 2 to a ring frame and a semiconductor wafer or a substrate;
 (b) dicing the semiconductor wafer or the substrate to make semiconductor chips or semiconductor components;
 (c) light irradiation by irradiating the adhesive sheet with an activating ray;
 (d) expanding by drawing the adhesive sheet to enlarge a gap between the semiconductor chips or the semiconductor components; and
 (e) picking up the semiconductor chips or the semiconductor components from the adhesive sheet.

5. The method of claim 4, wherein the electronic component is a package using a resin, ceramic, or metal.

* * * * *